(12) United States Patent
Moon et al.

(10) Patent No.: US 8,039,919 B2
(45) Date of Patent: Oct. 18, 2011

(54) MEMORY DEVICES HAVING A CARBON NANOTUBE

(75) Inventors: Seong-Ho Moon, Gyeonggi-do (KR); Hong-Sik Yoon, Gyeonggi-do (KR); Subramanya Mayya, Gyeonggi-do (KR); Sun-Woo Lee, Incheon (KR); Dong-Woo Kim, Incheon (KR); Xiaofeng Wang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 124 days.

(21) Appl. No.: 12/469,295

(22) Filed: May 20, 2009

(65) Prior Publication Data

US 2009/0289322 A1 Nov. 26, 2009

(30) Foreign Application Priority Data

May 20, 2008 (KR) ........................ 10-2008-0046676

(51) Int. Cl.
*H01L 29/40* (2006.01)
(52) U.S. Cl. ................. 257/485; 257/2; 257/3; 257/295; 257/296; 257/415; 257/476

(58) Field of Classification Search ........................ None
See application file for complete search history.

(56) References Cited

U.S. PATENT DOCUMENTS

2007/0025138 A1* 2/2007 Furukawa et al. ............ 365/151

FOREIGN PATENT DOCUMENTS

| KR | 10-0376199 | 3/2003 |
|---|---|---|
| KR | 10-0652410 | 11/2006 |

* cited by examiner

*Primary Examiner* — N Drew Richards
*Assistant Examiner* — Kyoung Lee
(74) *Attorney, Agent, or Firm* — Myers Bigel Sibley & Sajovec, P.A.

(57) ABSTRACT

In a memory device having a carbon nanotube and a method of manufacturing the same, the memory device includes a lower electrode, an upper electrode having a first void exposing a sidewall of a diode therein, an insulating interlayer pattern having a second void exposing a portion of the lower electrode between the lower electrode and the upper electrode, and a carbon nanotube wiring capable of being electrically connected with the diode of the upper electrode by a voltage applied to the lower electrode. The memory device may reduce generation of a leakage current in a cross-bar memory.

10 Claims, 11 Drawing Sheets

MEMORY DEVICES HAVING A CARBON NANOTUBE

This application claims priority under 35 U.S.C. §119 to Korean Patent Application No. 2008-46676, filed on May 20, 2008 in the Korean Intellectual Property Office (KIPO), the contents of which are herein incorporated by reference in their entirety.

BACKGROUND

1. Field

Example embodiments relate to memory devices having a carbon nanotube and methods of manufacturing the same. More particularly, example embodiments relate to memory devices having a carbon nanotube as a resistance switch and methods of manufacturing the same.

2. Description of the Related Art

Semiconductor devices having high data transmission speed are desired for many applications. One way of increasing the data transmission speed of a semiconductor device may be to increase an integration degree such that a chip includes a plenty of cells. A design rule for wirings in semiconductor chips has been reduced to a nanometer scale to increase the integration degree of the cells. However, reducing the design, rule of the wiring may cause some technical problems. For example, a specific resistance of a wiring may exponentially increase depending on a decrease of a critical dimension of the wiring. Hillocks caused by electro-migrations (which may increase the likelihood of cuts in the metal wiring) may occur. Formation of a diffusion barrier layer may become difficult in some applications. To overcome these problems, techniques for forming a wiring using a carbon nanotube have been investigated.

A carbon nanotube has a one-dimensional quantum-wire structure. The carbon nanotube also has electrical characteristics such as a quantum transport in one dimension. The carbon nanotube may have a good current density characteristic, as being compared with a metal wiring. For example, it has been experimentally proved that the carbon nanotube may have a current density of about $10^9$ A/cm$^2$, and may exhibit ballistic transport characteristics.

A memory device having a horizontal or vertical structure in which a carbon nanotube wiring may be used as a switching element has been researched by some companies (e.g., Nantero, Samsung Electronics, etc.). However, operational malfunctions due to a leakage current may frequently occur in such a memory device.

SUMMARY

Example embodiments provide memory devices having a carbon nanotube that may reduce generation of a leakage current in a cross-bar memory device having two crossing electrodes.

Example embodiments also provide methods of manufacturing a memory device having a carbon nanotube and a diode that may reduce generation of a leakage current in a cross-bar memory device.

According to example embodiments, a memory device may include a lower electrode, an upper electrode having a diode and a first void exposing a sidewall of the diode, an insulating interlayer pattern having a second void connected with the first void, and a carbon nanotube wiring extending from the lower electrode to the upper electrode. The insulating interlayer pattern may be positioned between the lower electrode and the upper electrode. The second void may expose a portion of the lower electrode. The carbon nanotube wiring may extend through the second void into the first void so that a free moving portion of the carbon nanotube wiring is positioned adjacent to the sidewall of the first void, and the free moving portion of the carbon nanotube wiring is configured to move to electrically contact the diode at the sidewall of the first void of the upper electrode responsive to a voltage applied to the lower electrode.

In an example embodiment, the lower electrode may be at least one lower wiring extending in a first direction, and the upper electrode may be at least one upper wiring extending in a second direction perpendicular to the first direction.

In an example embodiment, the first void may have a width larger than a width of the second void.

In an example embodiment, the upper electrode may include a diode including a first polysilicon pattern doped with n-type impurities and a second polysilicon pattern doped with p-type impurities. The first void may be defined by the second polysilicon pattern doped with p-type impurities, and the first polysilicon pattern doped with n-type impurities may horizontally surround the second polysilicon pattern.

In an example embodiment, the upper electrode may include a diode having a first polysilicon pattern doped with n-type impurities and a second polysilicon pattern doped with p-type impurities, and at least one metal pattern horizontally surrounding the diode.

In an example embodiment, the diode of the upper electrode may be a P-N junction diode or a Schottky diode.

In an example embodiment, the memory device may further include a catalyst layer formed on the lower electrode.

In an example embodiment, the lower electrode and the upper electrode may have a bar shape, and two bars of the lower electrode and the upper electrode may cross each other.

According to example embodiments, there is provided a method of manufacturing a memory device having a carbon nanotube. In the method, a lower electrode may be formed on a substrate, and an insulating interlayer may be formed on the lower electrode. An upper electrode including a diode may be formed on the insulating interlayer to have a first void exposing a sidewall of the diode and a portion of the insulating interlayer. A portion of the insulating interlayer may be partially removed to form an insulating interlayer pattern having a second void that exposes a portion of the lower electrode. The second void may be connected with the first void. A carbon nanotube wiring may be formed from the lower electrode through the second void and the first void. The carbon nanotube wiring may be capable of being electrically connected with the diode of the upper wiring by a voltage applied to the lower electrode.

In an example embodiment, the upper electrode having the diode may be formed by forming an n-type polysilicon pattern on the insulating interlayer to have a third void exposing a portion of the insulating interlayer, and by forming a p-type polysilicon pattern on a sidewall of the n-type polysilicon pattern exposed by the third void. The third void may have a dimension larger than that of the first void.

In an example embodiment, the upper electrode having the diode may be formed by forming a metal layer pattern on the insulating interlayer to have a fourth void exposing a portion of the insulating interlayer, by forming an n-type polysilicon pattern having a third void on a sidewall of the metal layer pattern exposed by the fourth void, and by forming a p-type polysilicon pattern on a sidewall of the n-type polysilicon pattern exposed by the third void. The fourth void may have a dimension larger than that of the first void, and the third void may have a dimension larger than that of the first void.

In an example embodiment, the insulating interlayer pattern having the second void may be formed by forming a mask spacer along a sidewall of the upper electrode exposed by the first void, by drying etching an exposed portion of the insulating interlayer to form the insulating interlayer pattern having the second void that exposes a portion of the lower electrode and by removing the mask spacer from the sidewall of the upper electrode. The second void may have a dimension smaller than that of the first void.

In an example embodiment, the carbon nanotube wiring may be formed by growing at least one carbon nanotube from a surface of the lower electrode exposed by the second void toward the upper electrode.

In an example embodiment, a contact metal layer may be formed on the lower electrode and a catalyst layer may be formed on the contact metal layer.

In an example embodiment, an upper insulation layer may be formed on the upper electrode and the carbon nanotube wiring.

According to example embodiments, a memory device may include an upper electrode of a memory cell including a diode in an upper portion of a stepped profile void therein having upper and lower sidewalls offset from one another. The upper sidewall may expose the diode.

According to example embodiments, there is provided a memory device including a lower electrode, an upper electrode having a diode which may extend in a direction perpendicular to an extending direction of the lower electrode, and a carbon nanotube wiring acting as a switch. The diode of the upper electrode may suppress generation of a leakage current in a memory cell having such a cross-bar structure. The diode of the upper electrode may have a unidirectional electric current property, so the memory device may have a stable rectifying property and also have a reduced leakage of an electric current into adjacent memory cells.

Additionally, the diode of the upper electrode may be simply formed by using a spacer formation process of polysilicon, and thus a manufacturing efficiency of a cross-bar memory device may be improved. Further, a distance between the carbon nanotube wiring and the upper electrode relating to operation of a device may be readily adjusted by changing a width of the polysilicon spacer.

BRIEF DESCRIPTION OF THE DRAWINGS

Example embodiments will be more clearly understood from the following detailed description taken in conjunction with the accompanying drawings.

FIG. 1 is a cross-sectional view illustrating a memory device having a carbon nanotube according to an example embodiment.

FIGS. 2 through 5 are cross-sectional views illustrating a method of manufacturing a memory device having a carbon nanotube illustrated in FIG. 1.

FIG. 6 is a cross-sectional view illustrating a memory device having a carbon nanotube according to an example embodiment.

FIGS. 7 and 8 are cross-sectional views illustrating a method of manufacturing a memory device having a carbon nanotube illustrated in FIG. 6.

FIG. 9 is a cross-sectional view illustrating a memory device having a carbon nanotube according to an example embodiment.

FIGS. 10 through 12 are cross-sectional views illustrating a method of manufacturing a memory device having a carbon nanotube illustrated in FIG. 9.

FIG. 13 is a cross-sectional view illustrating a memory device having a carbon nanotube according to an example embodiment.

FIGS. 14 through 16 are cross-sectional views illustrating a method of manufacturing a memory device having a carbon nanotube illustrated in FIG. 13.

FIG. 17 is a cross-sectional view illustrating a method of operating the memory device illustrated in FIG. 1.

FIG. 18 is a circuit having a memory device according to example embodiments.

FIG. 19 is a block diagram illustrating another example embodiment.

FIG. 20 is a block diagram illustrating another example embodiment.

FIG. 21 is a block diagram illustrating another example embodiment.

DETAILED DESCRIPTION OF EXAMPLE EMBODIMENTS

Figure 1:
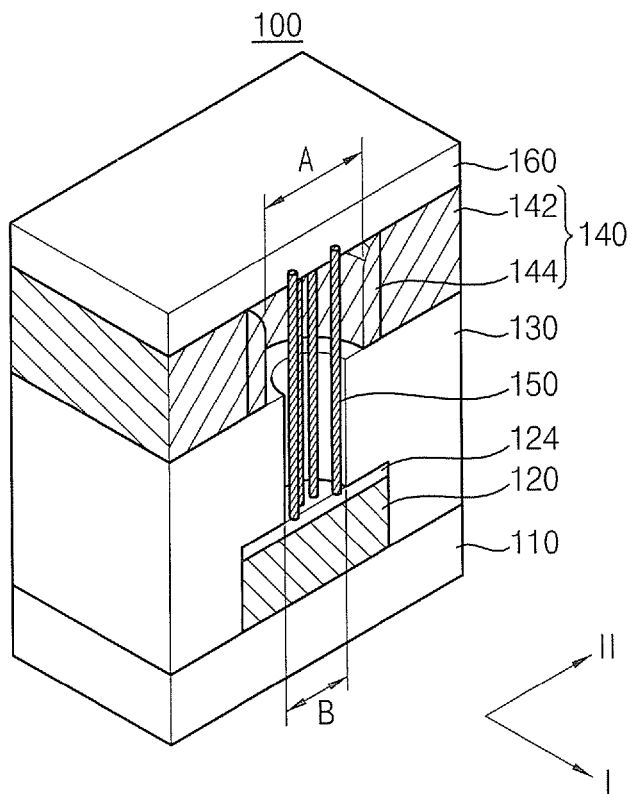
FIGS. 1-21 represent non-limiting, example embodiments as described herein.

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Embodiment 1

FIG. 1 is a cross-sectional view illustrating a memory device having a carbon nanotube according to an example embodiment.

Referring to FIG. 1, a memory device 100 may include a lower electrode 120, a catalyst layer 124, an insulating interlayer pattern 130, an upper electrode 140 having a diode, a carbon nanotube wiring 150 and an upper insulation layer 160.

The lower electrode 120 may be located on a substrate 110. The lower electrode 120 may have a line shape extending along a first direction (I) which is perpendicular to an extending direction (II) of the upper electrode 140. The lower electrode 120 may include a metal or polysilicon doped with impurities. The substrate 110 may be a silicon wafer, a silicon germanium wafer, an epitaxial substrate and the like.

The catalyst layer 124 may be positioned on the lower electrode 120. The catalyst layer 124 may be a catalytic metal layer or a porous active layer. The catalyst layer 124 may be provided to induce a rapid growth of a carbon nanotube from a surface of the lower electrode 120. The catalytic metal layer may include a transition metal or a noble metal (e.g., tungsten (W), nickel (Ni), iron (Fe), cobalt (Co), lead (Pb), platinum (Pt), gold (Au), etc.). The catalytic metal layer may have a thickness of about several nanometers to about several tens of nanometers.

Additionally, a contact metal layer may be positioned between the lower electrode 120 and the catalyst layer 124. The contact metal layer may have a good adhesiveness to the catalyst layer 124 and the lower electrode 120. The contact metal layer may include a metal (e.g., titanium (Ti), platinum (Pt), palladium (Pd), etc.). For example, the contact metal layer may be a titanium layer.

The upper electrode 140 may include a first void (A), and a diode having a sidewall exposed by the first void (A). The upper electrode 140 may be located on the insulating interlayer pattern 130. The upper electrode 140 may have a line shape extending along a second direction (II) perpendicular to the first direction (I) in which the lower electrode 120 extends. The first void (A) of the upper electrode 140 may be connected with a second void (B) formed in the insulating interlayer pattern 130. The first void (A) may have a dimension substantially larger than that of the second void (B).

The upper electrode 140 may be a diode itself. Alternatively, the upper electrode 140 may include a diode and an additional metal pattern horizontally surrounding the diode. For example, the upper electrode 140 may be a P-N junction diode which may include a first polysilicon pattern 142 doped with n-type impurities, and a second polysilicon pattern 144 doped with p-type impurities. The sidewall of the second polysilicon pattern 144 may be exposed by the first void (A). The second polysilicon pattern 144 may have an upper portion which may have a reduced dimension (e.g., a width) relative to a dimension of a lower portion. The first polysilicon pattern 142 may surround the second polysilicon pattern 144.

In other example embodiments, the upper electrode 140 may be a Schottky diode having a polysilicon pattern doped with n-type impurities or p-type impurities.

The insulating interlayer pattern 130 may be located on the catalyst layer 124. The insulating interlayer pattern 130 may be the second void (B) exposing a portion of the catalyst layer 124. The second void (B) of the insulating interlayer pattern 130 may be connected with the first void (A) of the upper electrode 140. The second void (B) may have a dimension smaller than that of the first void (A). For example, the second void (B) may have a width several nanometers to several tens nanometers smaller than that of the first void (A). The dimensions of the first void (A) and the second void (B) may be properly adjusted according to a dimension of the carbon nanotube wiring 150.

The insulating interlayer pattern 130 may include silicon oxide. Examples of the silicon oxide may include boro-phosphor silicate glass (BPSG), phosphor silicate glass (PSG), undoped silicate glass (USG), spin-on glass (SOG), tetraethyl orthosilicate (TEOS), PE-TEOS (plasma enhanced-tetraethyl orthosilicate), etc.

The carbon nanotube wiring 150 may be positioned on the lower electrode 120 and in the first void (A) of the upper electrode 140 and the second void (B) of the insulating interlayer pattern 130. A carbon nanotube may be grown from a surface of the catalyst layer 124 exposed through the first and the second voids (A, B) to form the carbon nanotube wiring 150. In some example embodiments, an upper face of the carbon nanotube wiring 150 may be disposed substantially the same as or higher than an upper face of the upper electrode 140. The carbon nanotube wiring 150 may be electrically connected with the lower electrode 120. The carbon nanotube wiring 150 may extend through the second void (B) into the first void (A) so that a free moving portion of the carbon nanotube wiring 150 is positioned adjacent to the sidewall of the first void (A), and the free moving portion of the carbon nanotube wiring 150 is configured to move to electrically contact the diode at the sidewall of the first void (A) of the upper electrode 140 responsive to a voltage applied to the lower electrode 120. When a current is not applied to the lower electrode 120, the carbon nanotube wiring 150 may be spaced apart from the upper electrode 140.

Additionally, the memory device may include an upper insulation layer 160 to cover the carbon nanotube wiring 150 and the upper electrode 140. The upper insulation layer 160 may include silicon oxide. Examples of the silicon oxide may include boro-phosphor silicate glass (BPSG), phosphor silicate glass (PSG), undoped silicate glass (USG), spin-on glass (SOG), tetraethyl orthosilicate (TEOS), PE-TEOS (plasma enhanced-tetraethyl orthosilicate), etc.

The memory device which includes the lower electrode 120, the carbon nanotube wiring 150 as a switch, and the upper electrode 140 having a diode may be a unit cell of a memory device having a cross-bar structure. In such a memory device, operational malfunctions of a memory cell caused by a leakage current may be suppressed or reduced.

FIGS. 2 through 5 are cross-sectional views illustrating a method of manufacturing a memory device having a carbon nanotube illustrated in FIG. 1.

Figure 2:
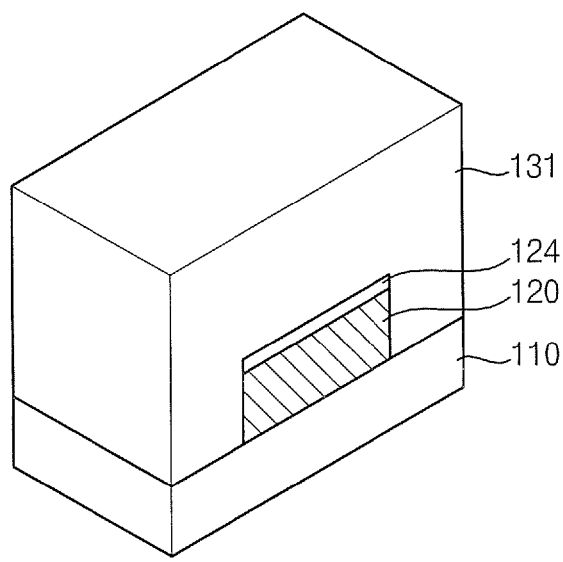

Referring to FIG. 2, a lower metal layer may be formed on a substrate 110. For example, the lower metal layer may be formed by depositing a metal (e.g., tantalum, copper, tungsten, titanium, aluminum, etc.).

A preliminary contact metal layer and a preliminary catalyst layer may be sequentially formed on the lower metal layer. The preliminary catalyst layer may be formed to have a thickness of about several nanometers to about several tens of nanometers. The preliminary catalyst layer may accelerate the growth of a carbon nanotube on the surface of a lower electrode 120. The preliminary catalyst layer, the preliminary contact metal layer and the lower metal layer may be sequentially patterned by an etching process. For example, after forming an etching mask (e.g., a silicon nitride layer pattern) on the preliminary catalyst layer, a dry etching process may be performed on the preliminary catalyst layer, the preliminary contact metal layer and the lower metal layer. As a result, a lower electrode 120, a contact metal layer (not illustrated) and a catalyst layer 124 may be formed on the substrate 110.

An insulating interlayer 131 may be formed on the substrate 110 to cover the catalyst layer 124 and the lower electrode 120. The insulating interlayer 131 may be formed by depositing or coating silicon oxide.

Figure 3:
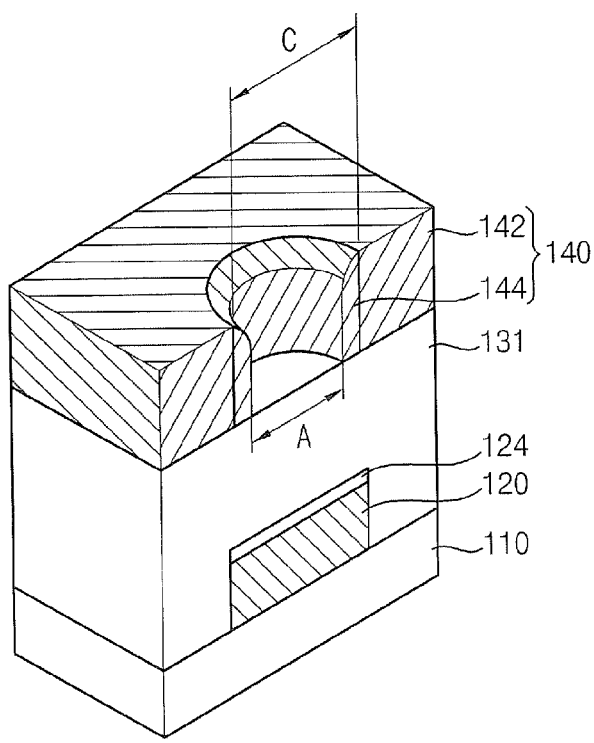

Referring to FIG. 3, an upper electrode 140 having a first void (A) exposing a sidewall of a diode may be formed on the insulating interlayer 131. The upper electrode 140 may be a P-N junction diode having a first polysilicon pattern 142 and a second polysilicon pattern 144.

For example, the first polysilicon pattern 142 doped with n-type impurities may be formed on the insulating interlayer 131 to have a third void (C) that may expose a portion of the insulating interlayer 131. The third void (C) may have a width substantially larger than that of the first void (A). The third void (C) may expose a sidewall of the first polysilicon pattern 142. A polysilicon layer doped with p-type impurities may be conformally formed on the first polysilicon pattern 142 having the third void (C). The polysilicon layer doped with p-type impurities may be dry etched. As a result, the second polysilicon pattern 144 doped with p-type impurities may be formed on the sidewall of the first polysilicon pattern 142 doped with n-type impurities. The second polysilicon pattern 144 may have a spacer shape as having an upper portion substantially narrower than a lower portion. The first void (A) of the upper electrode 140 may be defined by the second polysilicon pattern 144. The first void (A) may also expose a portion of the insulating interlayer 131 and the sidewall of the second polysilicon pattern 144.

Figure 4:
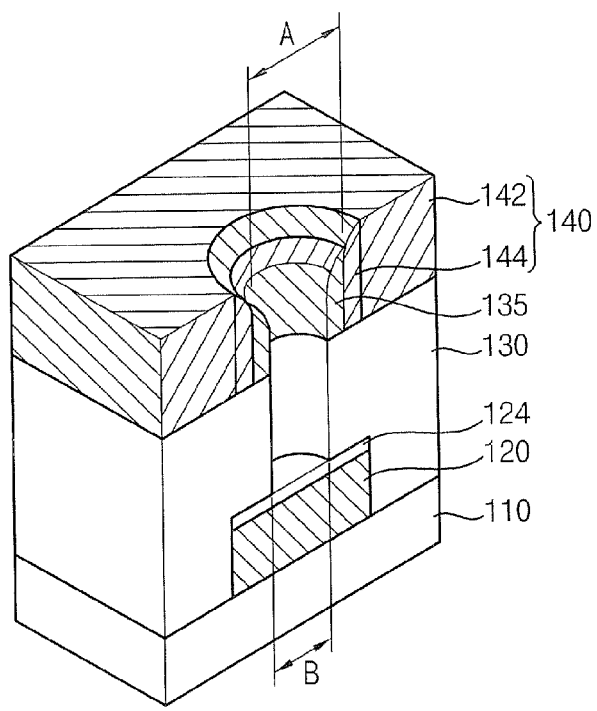

Referring to FIG. 4, a mask spacer 135 may be formed on a portion of the insulating interlayer 131 adjacent to the sidewall of the second polysilicon pattern 144. The mask spacer 135 may define a region in which a second void will be formed. The mask spacer 135 may be formed by forming a mask layer on the upper electrode 140 having the first void with a uniform thickness, and by dry etching the mask layer. The mask layer may be formed using silicon nitride.

After forming the mask spacer 135 adjacent to the sidewall of the upper electrode 140, an exposed portion of the insulating interlayer 131 may be etched until the catalyst layer 124 is exposed. As a result, an insulating interlayer pattern 130 having a second void (B) that may expose a portion of the catalyst layer 124 may be formed. The second void (B) of the insulating interlayer pattern 130 may be connected with the first void (A) of the upper electrode 140.

Figure 5:
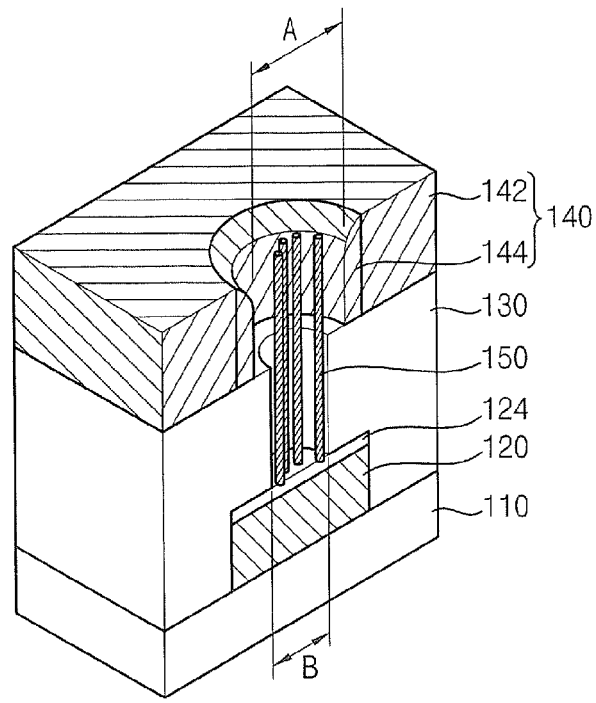

Referring to FIG. 5, the mask spacer 135 may be removed from the upper electrode 140. The mask spacer 135 having silicon nitride may be removed by performing a wet etching process using a phosphoric acid solution.

A carbon nanotube may be grown from a portion of the catalyst layer 124 exposed by the second void (B) to form a carbon nanotube wiring 150. The carbon nanotube wiring 150 may be formed by performing a chemical vapor deposition (CVD) process at a temperature of about 400-700° C. under a pressure of about 10-300 Torr in an atmosphere of hydrocarbon gas. While performing a CVD process using hydrocarbon gas, the hydrocarbon gas may be thermally decomposed into carbon. Such carbon may be introduced into the first void (A) and the second void (B) and then may be adsorbed onto a surface of the catalyst layer 124. Accordingly, a carbon nanotube may be grown from the surface of the catalyst layer 124. The carbon nanotube wiring 150 may include at least one carbon nanotube formed in the first void (A) and the second void (B) on the lower electrode 120. The carbon nanotube wiring 150 may be electrically connected with the lower electrode 120. An upper face of the carbon nanotube wiring 150 may positioned substantially the same as or higher than an upper face of the upper electrode 140.

An upper insulation layer 160 may be formed on the upper electrode 140 and the carbon nanotube wiring 150. As a result, a memory device illustrated in FIG. 1 may be manufactured.

Embodiment 2

Figure 6:
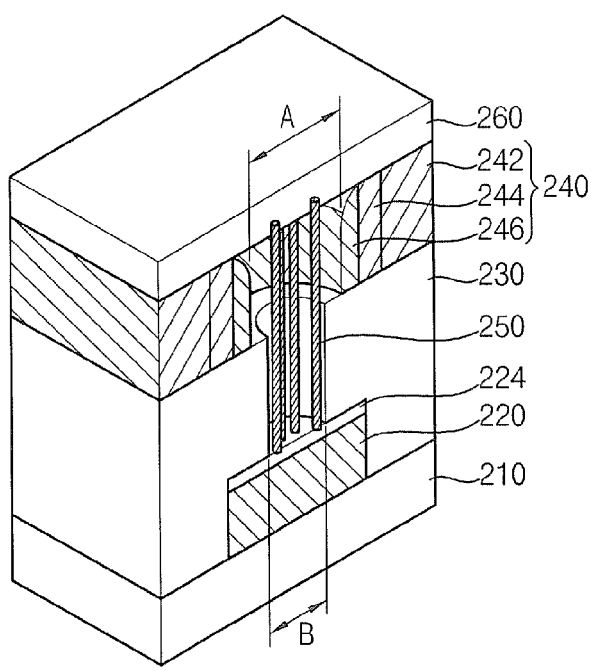

FIG. 6 is a cross-sectional view illustrating a memory device having a carbon nanotube according to an example embodiment.

Referring to FIG. 6, a memory device 200 may include a lower electrode 220, a catalyst layer 224, an insulating interlayer pattern 230, an upper electrode 240 having a diode, a carbon nanotube wiring 250 and an upper insulation layer 260. The lower electrode 220, the catalyst layer 224, the insulating interlayer pattern 230 and the carbon nanotube wiring 250 may be the same as those described in Embodiment 1.

The upper electrode 240 may include a diode 242, 244, an ohmic contact 246 and a first void (A) exposing the ohmic contact 246. The first void (A) may be connected with the second void formed in the insulating interlayer pattern 230. The first void (A) may have a width substantially larger than that of the second void (B).

In example embodiments, the upper electrode 240 may include a P-N junction diode and the ohmic contact 246. The P-N junction diode may include a first polysilicon pattern 242 doped with n-type impurities and a second polysilicon pattern 244 doped with p-type impurities. The second polysilicon pattern 244 may horizontally surround the ohmic contact 246 having the first void, and the first polysilicon pattern 242 may also horizontally surround the second polysilicon pattern 244. The ohmic contact 246 may be positioned on a side of the diode exposed by the first void such that the ohmic contact 246 may be contacted with the carbon nanotube wiring 250. The ohmic contact 246 may be a metal pattern or a metal silicide pattern, but not limited to these. The ohmic contact 246 may include a metal employed in forming an ohmic contact layer of a semiconductor device. The ohmic contact 246 may have a spacer shape as having an upper portion substantially narrower than a lower portion.

The memory device 200 which includes the lower electrode 220, the carbon nanotube wiring 250 as a switch, and the upper electrode 240 having a diode may be a unit cell of a memory device having a cross-bar structure. In such a memory device, operational malfunctions of a memory cell caused by a leakage current may be suppressed or reduced.

Figure 7:
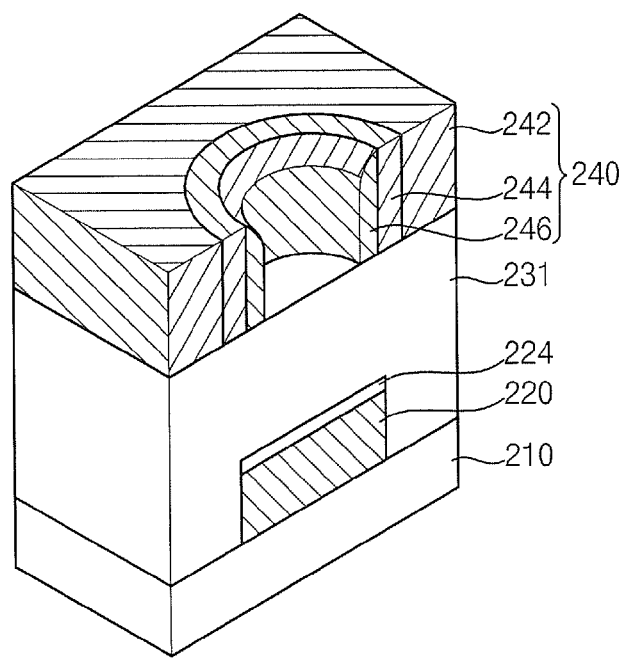
Figure 8:
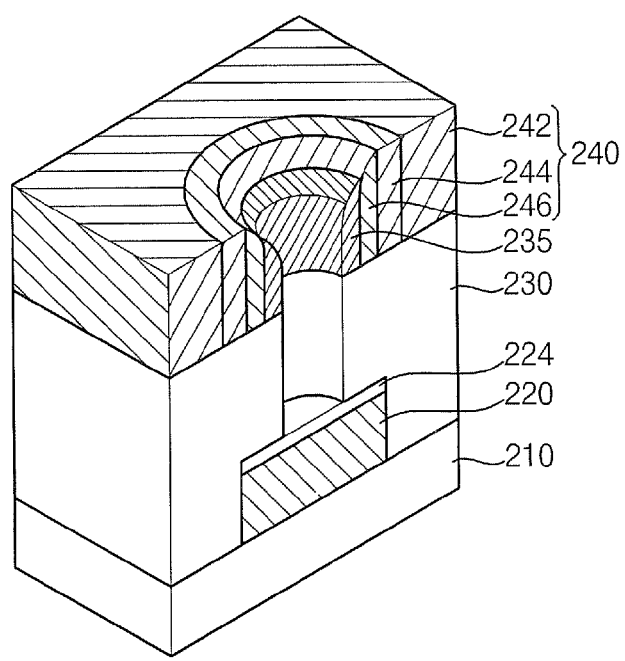

FIGS. 7 and 8 are cross-sectional views illustrating a method of manufacturing a memory device having a carbon nanotube illustrated in FIG. 6.

Referring to FIG. 7, a lower electrode 220, a catalyst layer 224, an insulating interlayer 231, a first polysilicon pattern 242 doped with n-type impurities and a second polysilicon pattern 244 doped with p-type impurities may be formed on a substrate 210 by performing processes described in Embodiment 1.

An ohmic contact 246 may be formed on a sidewall of the second polysilicon pattern 246 to define a first void (A). Accordingly, the upper electrode 240 may be formed to include the ohmic contact 246 and a P-N junction diode having the first polysilicon pattern 242 doped with n-type impurities and the second polysilicon pattern 244 doped with p-type impurities. For example, the ohmic contact 246 may be formed by conformally forming an ohmic layer on the first polysilicon pattern 242 and the second polysilicon pattern 246 having a third void (not illustrated), and by dry etching the ohmic layer such that the ohmic contact 246 remains on the sidewall of the second polysilicon pattern 246 exposed by the third void. The ohmic contact 246 may define the first void (A) smaller than the third void. The ohmic contact 246 may have a spacer shape as having an upper portion substantially narrower than a lower portion.

Referring to FIG. 8, a mask spacer 235 may be formed on the sidewall of the ohmic contact 246 exposed by the first void. The mask spacer 235 may expose a portion of the insulating interlayer 231 to define a region in which a second void (B) will be formed. An exposed portion of the insulating interlayer 231 may be etched until the catalyst layer 224 is exposed. As a result, an insulating interlayer pattern 230 having the second void (B) that may expose a portion of the catalyst layer 224 may be formed. The second void (B) of the insulating interlayer pattern 230 may be connected with the first void (A) of the upper electrode 240.

After removing the mask spacer 235 from the upper electrode 240, the carbon nanotube wiring 250 may be formed by growing at least one carbon nanotube from the catalyst layer 224 exposed by the second void (B). An upper insulation layer 260 may be formed on the upper electrode 240 and the carbon nanotube wiring 250. As a result, a memory device illustrated in FIG. 6 may be manufactured.

Embodiment 3

Figure 9:
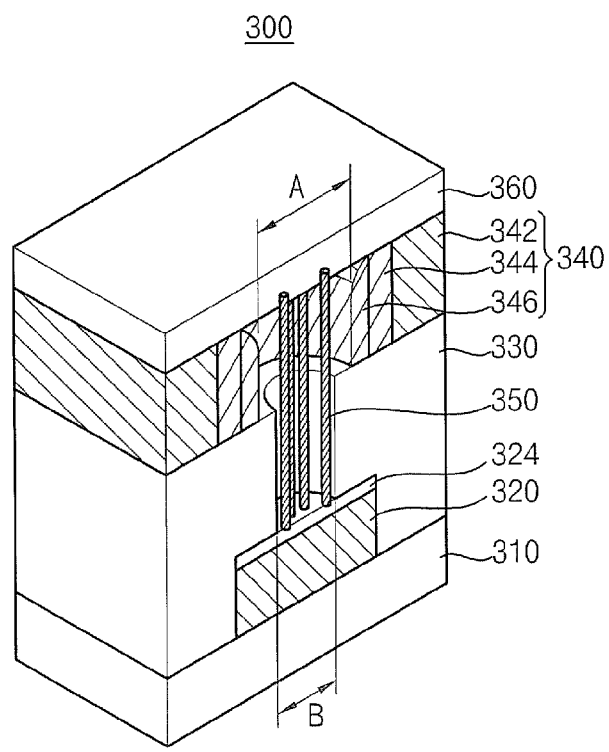

FIG. 9 is a cross-sectional view illustrating a memory device having a carbon nanotube according to an example embodiment.

Referring to FIG. 9, a memory device 300 may include a lower electrode 320, a catalyst layer 324, an insulating interlayer pattern 330, an upper electrode 340 having a diode, a carbon nanotube wiring 350 and an upper insulation layer 360. The lower electrode 320, the catalyst layer 324, the insulating interlayer pattern 330 and the carbon nanotube wiring 350 may be the same as those described in Embodiment 1.

The upper electrode 340 may include a diode 344, 346 and a metal pattern 342. The upper electrode 340 may include a first void (A) exposing a sidewall of the diode 344, 346. The diode 344, 346 may be a P-N junction diode. The first void (A) may be connected with a second void (B) formed in the insulating interlayer pattern 330. The first void (A) may have a width substantially larger than that of the second void (B).

In example embodiments, the upper electrode 340 may include the metal pattern 342 and a P-N junction diode including a first polysilicon pattern 344 doped with n-type impurities and a second polysilicon pattern 346 doped with p-type impurities. The metal pattern 342 may horizontally surround the first polysilicon pattern 344, and the first polysilicon pattern 344 may also horizontally surround the second polysilicon pattern 346 having the first void (A). The sidewall of the second polysilicon pattern 346 may be exposed by the first void (A). The second polysilicon pattern 346 may have a spacer shape as having an upper portion narrower that a lower portion. The metal pattern 342 of the upper electrode 340 may reduce an electrical resistance of the upper electrode 340.

The memory device 300 which includes the lower electrode 320, the carbon nanotube wiring 350 as a switch, and the upper electrode 340 having the diode 344, 346 and the metal pattern 342 may be a unit cell of a memory device having a cross-bar structure. In such a memory device, operational malfunctions of a memory cell caused by a leakage current may be suppressed or reduced.

Figure 10:
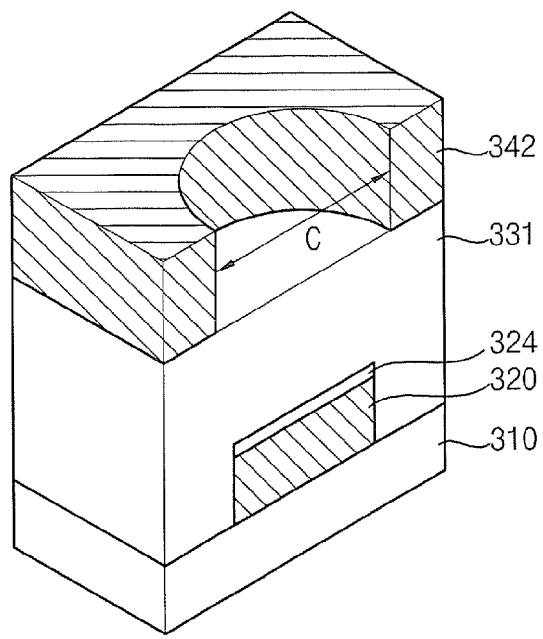
Figure 11:
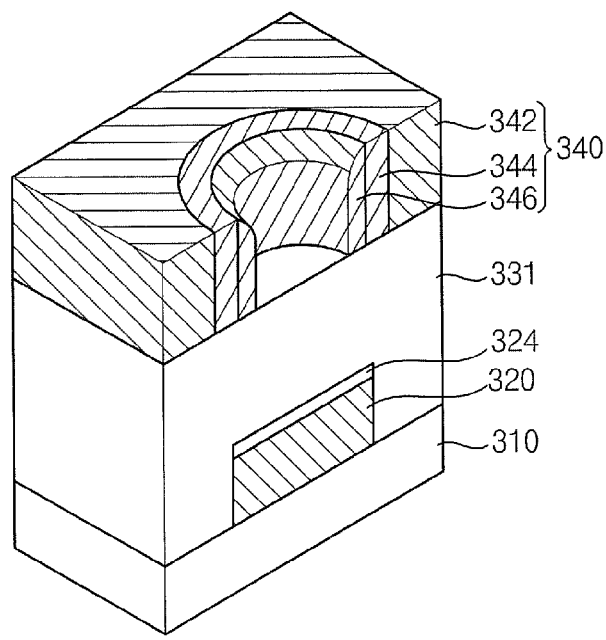
Figure 12:
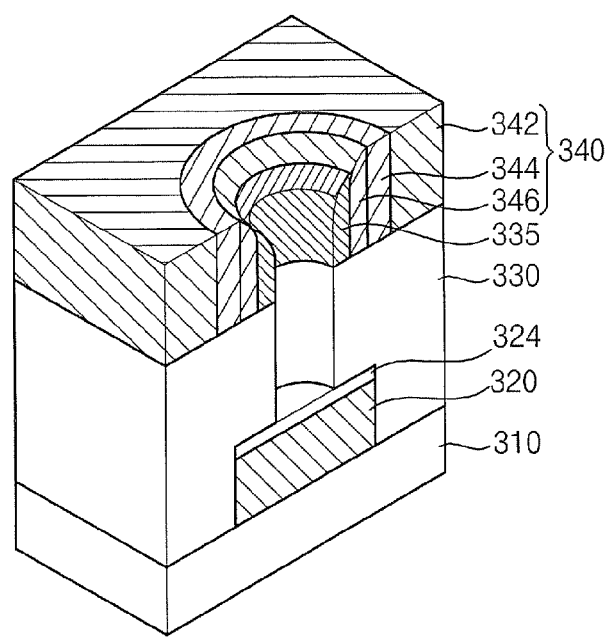

FIGS. 10 through 12 are cross-sectional views illustrating a method of manufacturing a memory device having a carbon nanotube illustrated in FIG. 9.

Referring to FIG. 10, a lower electrode 320, a catalyst layer 324 and an insulating interlayer 331 may be formed on a substrate 310 by performing processes described in Embodiment 1. A metal pattern 342 may be formed on the insulating interlayer 331 to include a fourth void (C) that exposes a portion of the insulating interlayer 331. The fourth void (C) may have a width substantially larger than that of the first void (A) of the upper electrode 340. A sidewall of the metal pattern 342 may be exposed by the fourth void (C).

Referring to FIG. 11, a polysilicon layer doped with n-type impurities may be conformally formed on the metal pattern 342 having the fourth void (C), and then the polysilicon layer doped with n-type impurities may be dry etched. As a result, the first polysilicon pattern 344 doped with n-type impurities may be formed on the sidewall of the metal pattern 342. The first polysilicon pattern 344 may have a third void (not illustrated) smaller than the fourth void (C). A sidewall of the first polysilicon pattern 344 may be exposed by the third void. Thereafter, a second polysilicon pattern 346 doped with p-type impurities may be formed on a sidewall of the first polysilicon pattern 344 exposed by the third void in the similar manner to the formation of the first polysilicon pattern 344. The second polysilicon pattern 346 may be formed to have the first void (A) that may expose a portion of the insulating interlayer 331. Accordingly, the upper electrode including the metal pattern 342 and the P-N junction diode 344, 346 which may have the first polysilicon pattern 344 doped with n-type impurities and the second polysilicon pattern 346 doped with p-type impurities.

Referring to FIG. 12, a mask spacer 335 may be formed on the sidewall of the second polysilicon pattern 346 exposed by the first void (A). The mask spacer 335 may expose a portion of the insulating interlayer 331 to define a region in which a second void (B) will be formed. An exposed portion of the insulating interlayer 331 may be etched until the catalyst layer 324 is exposed. As a result, an insulating interlayer pattern 330 having the second void (B) that may expose a portion of the catalyst layer 324 may be formed. The second void (B) of the insulating interlayer pattern 330 may be connected with the first void (A) of the upper electrode 340.

After removing the mask spacer 335 from the upper electrode 340, the carbon nanotube wiring 350 may be formed on the lower electrode 320 by growing at least one carbon nanotube from the catalyst layer 324 exposed by the second void (B). An upper insulation layer 360 may be formed on the upper electrode 340 and the carbon nanotube wiring 350. As a result, a memory device illustrated in FIG. 9 may be manufactured.

Embodiment 4

Figure 13:
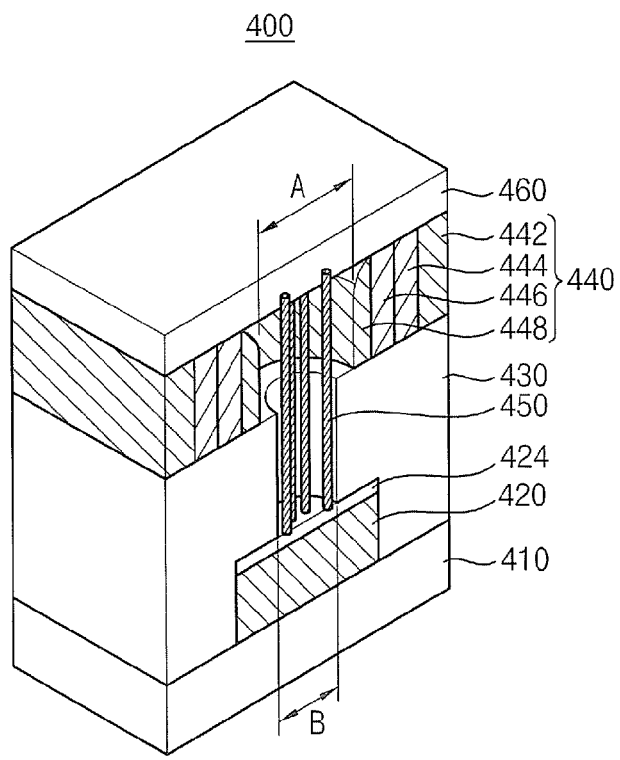

FIG. 13 is a cross-sectional view illustrating a memory device having a carbon nanotube according to an example embodiment.

Referring to FIG. 13, a memory device 400 may include a lower electrode 420, a catalyst layer 424, an insulating interlayer pattern 430, an upper electrode 440 having a diode, a carbon nanotube wiring 450 and an upper insulation layer 460. The lower electrode 420, the catalyst layer 424, the insulating interlayer pattern 430 and the carbon nanotube wiring 450 may be the same as those described in Embodiment 1.

The upper electrode 440 may include an ohmic contact 448 having a first void (A), a diode 444, 446, and a metal pattern 442. The first void (A) may be connected with a second void formed in the insulating interlayer pattern 430. The first void (A) may have a width substantially larger than that of the second void (B). The diode 444, 446 may horizontally surround the ohmic contact 448 having the first void (A), and the metal pattern 442 may also horizontally surround the diode 444, 446. The ohmic contact 448 may be positioned on a side of the diode 444, 446 exposed by the first void (A) such that the ohmic contact 448 may be contacted with the carbon nanotube wiring 450. The ohmic contact 448 may be a metal pattern or a metal silicide pattern, but not limited to these. The ohmic contact 448 may have a spacer shape as having an upper portion substantially narrower than a lower portion.

In example embodiments, the upper electrode 440 may include a P-N junction diode 444, 446 and the ohmic contact 448. The P-N junction diode may include a first polysilicon pattern 444 doped with n-type impurities and a second polysilicon pattern 446 doped with p-type impurities. The metal pattern 442 of the upper electrode 440 may reduce an electrical resistance of the upper electrode 440 having a diode.

The memory device 400 which includes the lower electrode 420, the carbon nanotube wiring 450 as a switch, and the upper electrode 440 having a diode may be a unit cell of a memory device having a cross-bar structure. In such a memory device, operational malfunctions of a memory cell caused by a leakage current may be suppressed or reduced.

Figure 14:
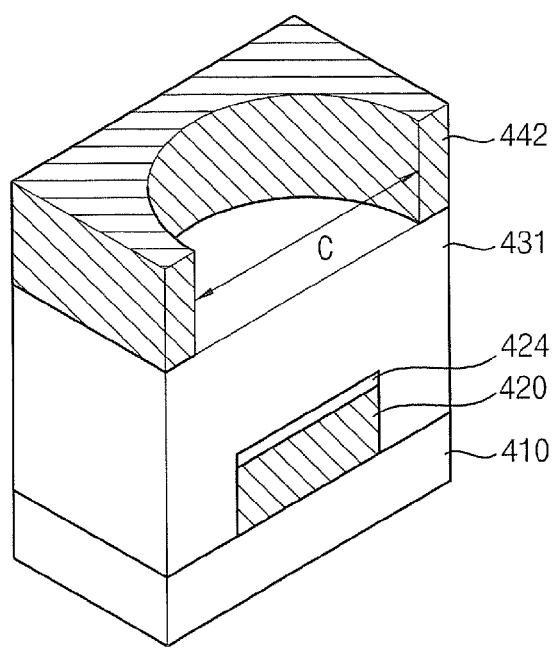
Figure 15:
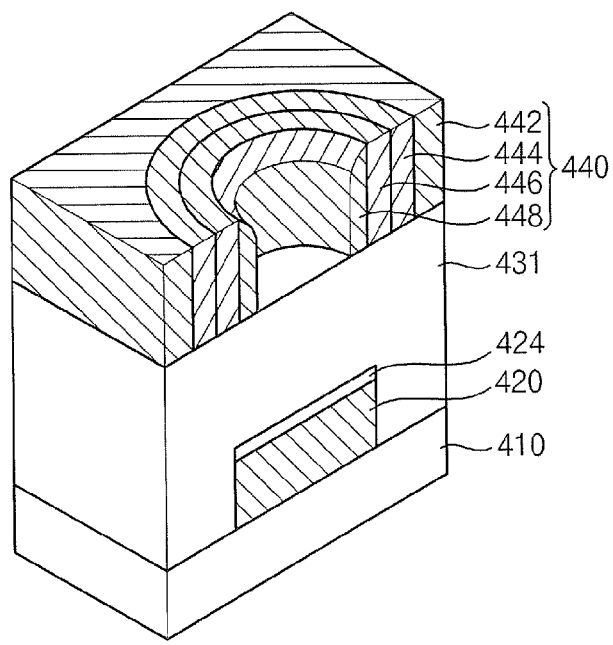
Figure 16:
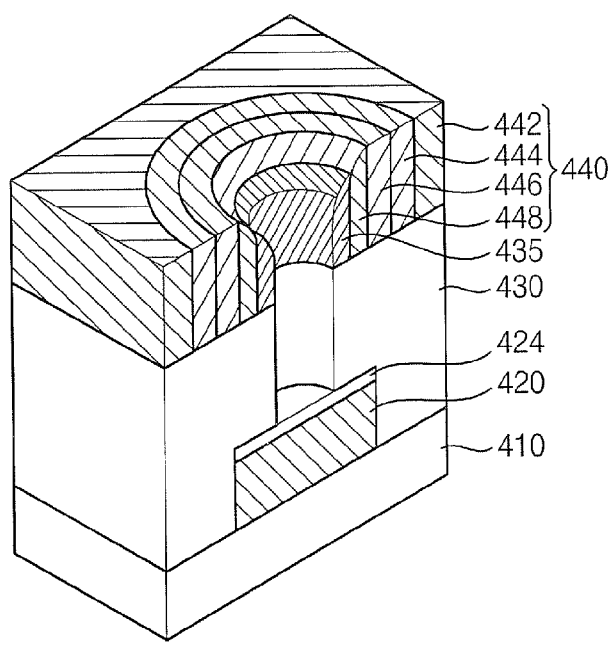

FIGS. 14 through 16 are cross-sectional views illustrating a method of manufacturing a memory device having a carbon nanotube illustrated in FIG. 13.

Referring to FIG. 14, a lower electrode 420, a catalyst layer 424 and an insulating interlayer 431 may be formed on a substrate 410 by performing processes described in Embodiment 1. A metal pattern 442 may be formed on the insulating interlayer 431 to include a firth void (C) that exposes a portion of the insulating interlayer 431. The fifth void (C) may have a width substantially larger than that of the first void (A) of the upper electrode 440. A sidewall of the metal pattern 442 may be exposed by the fifth void (C).

Referring to FIG. 15, a polysilicon layer doped with n-type impurities may be formed on the metal pattern 442 having the fifth void (C) with a uniform thickness, and then the polysilicon layer doped with n-type impurities may be dry etched such that a portion of the polysilicon layer doped with n-type impurities may remain on a sidewall of the fifth void (C). As a result, the first polysilicon pattern 444 doped with n-type impurities may be formed on the sidewall of the metal pattern 442. A sidewall of the first polysilicon pattern 444 may be exposed by a fourth void (not illustrated). Thereafter, a second polysilicon pattern 446 doped with p-type impurities may be formed on a sidewall of the first polysilicon pattern 444 exposed by the fourth void in the similar manner to the formation of the first polysilicon pattern 444. The second polysilicon pattern 446 may be formed to have a third void (not illustrated) that may expose a portion of the insulating interlayer 431. Accordingly, a P-N junction diode 444, 446 which may have the first polysilicon pattern 444 doped with n-type impurities and the second polysilicon pattern 446 doped with p-type impurities may be formed.

An ohmic contact 448 may be formed on a sidewall of the second polysilicon pattern 446 to define a first void (A). The ohmic contact 448 may have a spacer shape as having an upper portion substantially narrower than a lower portion. Accordingly, the upper electrode 440 may be formed to include the metal pattern 442, the P-N junction diode having the second polysilicon pattern 446 doped with p-type impurities and the first polysilicon pattern 444 doped with n-type impurities, and the ohmic contact 448.

Referring to FIG. 16, a mask spacer 435 may be formed on the sidewall of the ohmic contact 446 exposed by the first void (A). The mask spacer 435 may expose a portion of the insulating interlayer 431 to define a region in which a second void (B) will be formed. An exposed portion of the insulating interlayer 431 may be etched until the catalyst layer 424 is exposed. As a result, an insulating interlayer pattern 430 having the second void (B) that may expose a portion of the catalyst layer 424 may be formed. The second void (B) of the insulating interlayer pattern 430 may be connected with the first void (A) of the upper electrode 440.

After removing the mask spacer 435 from the upper electrode 440, the carbon nanotube wiring 450 may be formed on the lower electrode 420 by growing at least one carbon nanotube from the catalyst layer 424 exposed by the second void (B). An upper insulation layer 460 may be formed on the upper electrode 440 and the carbon nanotube wiring 450. As a result, a memory device illustrated in FIG. 13 may be manufactured.

Embodiment 5

Figure 17:
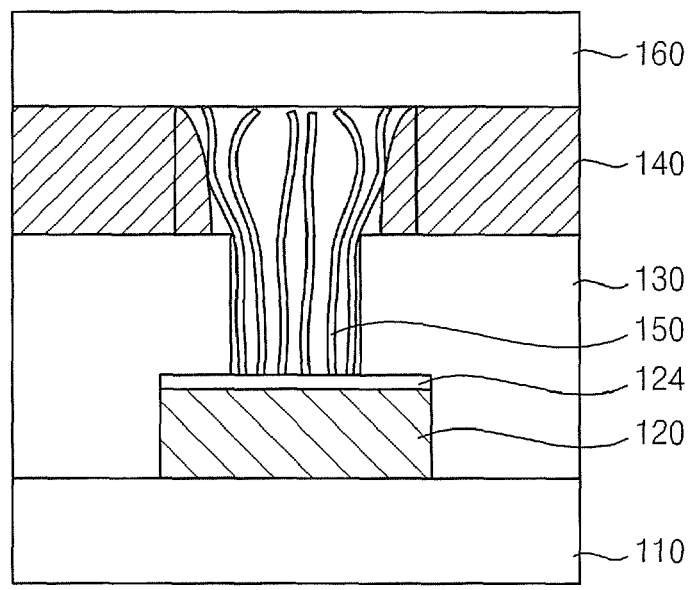
Figure 18:
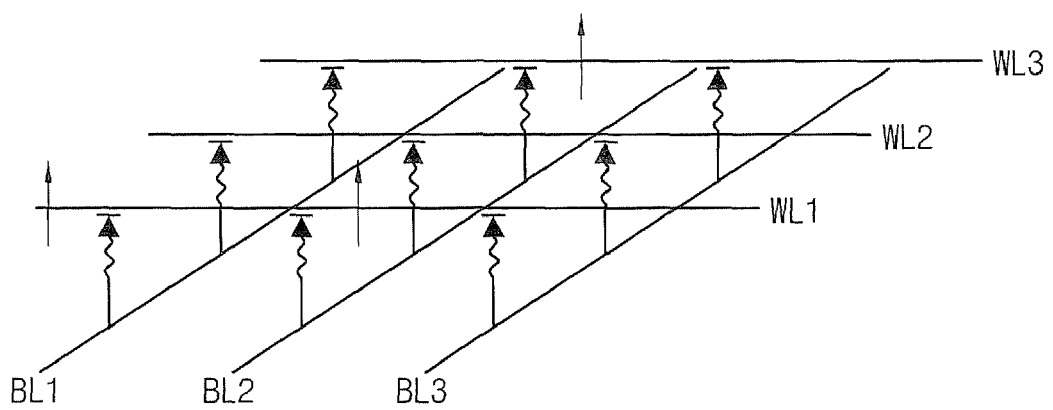

FIG. 17 is a cross-sectional view illustrating a method of operating the memory device illustrated in FIG. 1. FIG. 18 is a circuit having a memory device according to example embodiments.

Referring to FIGS. 17 and 18, two bias voltages having different polarities may be applied to the lower electrode 120 and the upper electrode 140, respectively. The lower electrode 120 may be a lower wiring extending in a first direction, and the upper electrode 140 may be an upper wiring extending in a second direction perpendicular to the first direction. In this case, an electrostatic attraction may occur between the upper electrode 140 and the carbon nanotube wiring 150. When the electrostatic attraction is larger than an energy barrier, the carbon nanotube wiring 150 may contact with the diode of the upper wiring. This state may be defined as an "on" state. The energy barrier may be determined by an inherent elasticity of the carbon nanotube wiring 150 as well as a distance between the carbon nanotube wiring 150 and the upper electrode 140. The diode of the upper electrode 140 may have a unidirectional electric current property, so the diode may provide a stable rectifying property of the memory device and also suppress a leakage of an electric current into adjacent memory cells.

When two bias voltages having the same polarity are applied to the lower electrode 120 and the upper electrode 140, an electrostatic repulsion may occur between the upper electrode 140 and the carbon nanotube wiring 150. When the electrostatic repulsion is larger than an energy barrier, the carbon nanotube wiring 150 may be spaced apart from the upper electrode 140. This state may be defined as an "off" state. The memory device may be a switch as exploiting the "on" state and the "off" state of the carbon nanotube wiring 150.

Embodiment 6

Figure 19:
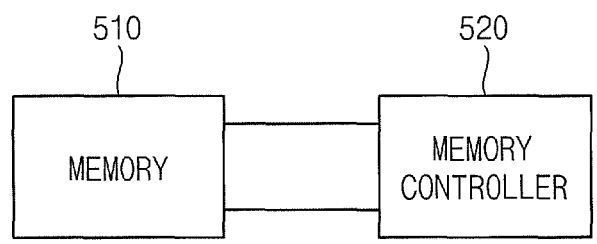

FIG. 19 is a block diagram illustrating another example embodiment. Referring to FIG. 19, a memory 510 is connected to a memory controller 520. The memory 510 may be a flash memory device having a unit cell that includes the lower electrode, the carbon nanotube wiring as a resistance switch and the upper electrode having a diode according to Embodiments 1 through 4.

The memory controller 520 may provide input signal to control operations of the memory device 520. For example, a memory controller of a memory card may transfer a command of a host to control input/output data and control various data of a memory based on an applied control signal. The memory 510 and the memory controller 520 may be applied to not only the memory card but also digital products including a memory.

Embodiment 7

Figure 20:
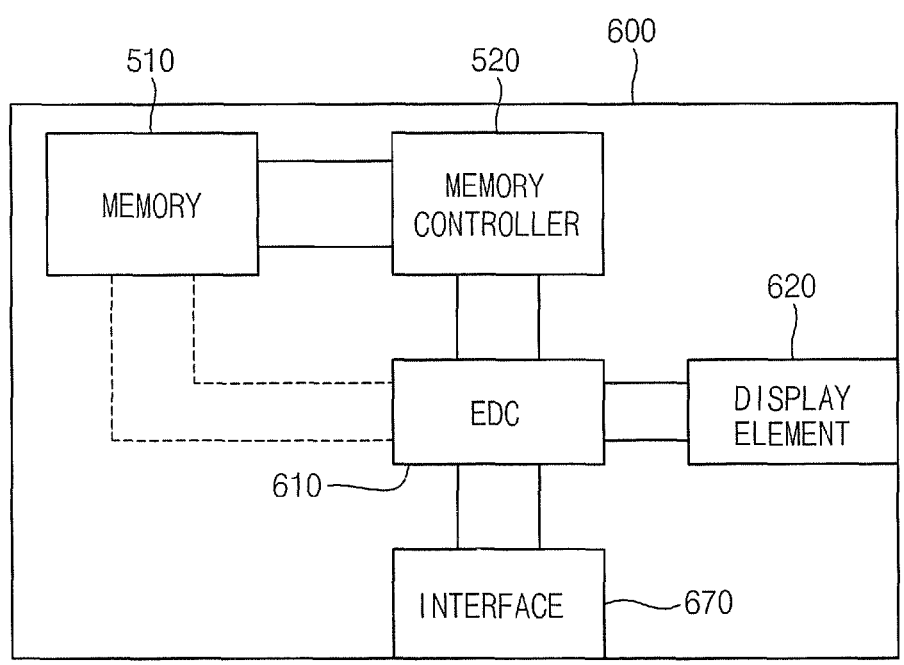

FIG. 20 is a block diagram illustrating another example embodiment.

Referring to FIG. 20, this example embodiment represents a portable device 600.

Examples of the portable device 600 may include a MP3 player, an audio player, a video player, a portable-multimedia player which are capable of playing audio and video, etc. The portable device 600 may include a memory 510, a memory controller 520, an encoder and decoder (EDC) 610, presentation components 620 and interface 630. The memory 510 may be a flash memory device having a unit cell that includes the lower electrode, the carbon nanotube wiring as a resistance switch and the upper electrode having a diode according to Embodiments 1 through 4.

Data is input to and output from the memory 510 via the memory controller 520 by all encoder and decoder (EDC) 610. As shown by the dashed lines in FIG. 14, the data may be directly input to the memory 510 from the EDC 610 and/or directly output from the memory 510 to the EDC 610.

The EDC 610 encodes data for storage in the memory 510. For example, the EDC 610 may perform MP3 encoding on audio data for storage in the memory 510. Alternatively, the EDC 610 may perform MPEG encoding (e.g., MPEG2, MPEG4, etc.) on video data for storage in the memory 510.

Still further, the EDC 610 may include multiple encoders for encoding different types of data according to different data formats. For example, the EDC 610 may include an MP3 encoder for audio data and an MPEG encoder for video data.

The EDC 610 may decode output from the memory 510. For example, the EDC 610 may perform MP3 decoding on audio data output from the memory 510. Alternatively, the EDC 610 may perform MPEG decoding (e.g., MPEG2, MPEG4, etc.) on video data output from the memory 510. Still further, the EDC 610 may include multiple decoders for decoding different types of data according to different data formats. For example, the EDC 610 may include an MP3 decoder for audio data and an MPEG decoder for video data.

It will also be appreciated that EDC 610 may include only decoders. For example, already encoded data may be received by the EDC 610 and passed to the memory controller 520 and/or the memory 510.

The EDC 610 may receive data for encoding, or receive already encoded data, via the interface 630. The interface 630 may conform to a known standard (e.g., firewire, USB, etc.). The interface 630 may also include more than one interface. For example, interface 630 may include a firewire interface, a USB interface, etc. Data from the memory 510 may also be output via the interface 630.

The presentation components 620 may present data output from the memory, and/or decoded by the EDC 610, to a user. For example, the presentation components 620 may include a speaker jack for outputting audio data, a display screen for outputting video data, and/or etc.

Embodiment 8

Figure 21:
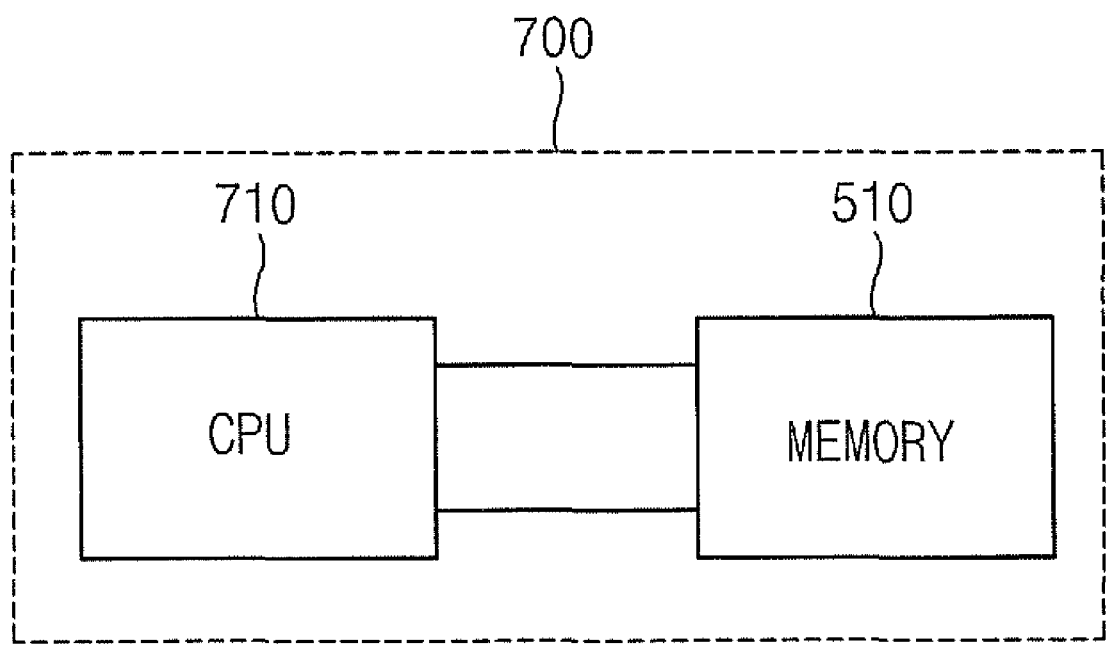

FIG. 21 is a block diagram illustrating another example embodiment.

Referring to FIG. 21, a memory 510 is connected to a central processing unit (CPU) 710 within a computer system 700. The memory 510 may be a flash memory device having a unit cell that includes the lower electrode, the carbon nanotube wiring as a resistance switch and the upper electrode having a diode according to Embodiments 1 through 4.

As one example, the computer system 700 may be laptop computer using flash memory devices as a main storage medium. As another example, the computer system 700 may be digital products including the memory 510 which capable of storing data and controlling function of the digital products. The memory 510 may be directly connected with the CPU 710, connected via bus, etc. It will be appreciated, that FIG. 21 does not illustrate the full complement of components that may be included within a computer system 800 for the sake of clarity.

According to example embodiments, there is provided a memory device including a lower electrode, an upper electrode having a diode which may extend in a direction perpendicular to an extending direction of the lower electrode, and a carbon nanotube wiring acting as a switch. The diode of the upper electrode may suppress generation of a leakage current in a memory cell having such a cross-bar structure. The diode of the upper electrode may have a unidirectional electric current property, so the memory device may have a stable rectifying property and also have a reduced leakage of an electric current into adjacent memory cells.

Additionally, the diode of the upper electrode may be simply formed by using a spacer formation process of polysilicon, and thus a manufacturing efficiency of a cross-bar memory device may be improved. Further, a distance between the carbon nanotube wiring and the upper electrode relating to operation of a device may be readily adjusted by changing a width of the polysilicon spacer.

The foregoing is illustrative of example embodiments and is not to be construed as limiting thereof. Although a few example embodiments have been described, those skilled in the art will readily appreciate that many modifications are possible in the example embodiments without materially departing from the novel teachings of example embodiments. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it may be to be understood that the foregoing may be illustrative of various example embodiments and is not to be construed as limited to the specific example embodiments disclosed, and that modifications to the disclosed example embodiments, as well as other example embodiments, are intended to be included within the scope of the appended claims.

The invention claimed is:

1. A memory device having a carbon nanotube, comprising:
   a lower electrode;
   an upper electrode including a diode in a first void of the upper electrode wherein a sidewall of the first void exposes the diode;
   an insulating interlayer pattern between the lower electrode and the upper electrode, wherein the insulating interlayer pattern includes a second void connected with the first void, wherein the second void exposes a portion of the lower electrode; and
   carbon nanotube wiring electrically connected to the exposed portion of the lower electrode and extending through the second void into the first void so that a free moving portion of the carbon nanotube wiring is positioned adjacent to the sidewall of the first void, wherein the free moving portion of the carbon nanotube wiring is configured to move to electrically contact the diode at the sidewall of the first void of the upper electrode responsive to a voltage applied to the lower electrode.

2. The memory device of claim 1, wherein the lower electrode is at least one lower wiring extending in a first direction, and the upper electrode is at least one upper wiring extending in a second direction perpendicular to the first direction.

3. The memory device of claim 1, wherein the first void has a width larger than a width of the second void.

4. The memory device of claim 1, wherein the upper electrode comprises a diode including a first polysilicon pattern doped with n-type impurities and a second polysilicon pattern doped with p-type impurities.

5. The memory device of claim 4, wherein the second polysilicon pattern doped with p-type impurities has a sidewall exposed by the first void, and the first polysilicon pattern doped with n-type impurities horizontally surrounds the second polysilicon pattern.

6. The memory device of claim 1, wherein the upper electrode comprises a diode including a first polysilicon pattern doped with n-type impurities and a second polysilicon pattern doped with p-type impurities, and at least one metal pattern horizontally surrounding the diode.

7. The memory device of claim 1, wherein the diode is a P-N junction diode or a Schottky diode.

8. The memory device of claim 1, further comprising a catalyst layer formed on the lower electrode.

9. The memory device of claim 1, wherein the lower electrode and the upper electrode have a bar shape, and two bars of the lower electrode and the upper electrode cross each other.

10. A memory device including a carbon nanotube, comprising:
    an upper electrode of a memory cell including a diode in an upper portion of a stepped profile void therein having upper and lower sidewalls offset from one another wherein the upper sidewall exposes the diode.

* * * * *